United States Patent [19]

Yamada et al.

[11] 4,254,346

[45] Mar. 3, 1981

[54] MONOSTABLE MULTIVIBRATOR

[75] Inventors: Tsuneo Yamada; Yukihiko Miyamoto, both of Tokyo, Japan

[73] Assignee: Trio Kabushiki Kaisha, Tokyo, Japan

[21] Appl. No.: 967,639

[22] Filed: Dec. 8, 1978

[30] Foreign Application Priority Data

Mar. 15, 1978 [JP] Japan ................... 53-29653

[51] Int. Cl.³ ................. H03K 3/284; H03K 5/01
[52] U.S. Cl. ................... 307/273; 307/268
[58] Field of Search ................ 307/273, 268

[56] References Cited

U.S. PATENT DOCUMENTS

| | | | |
|---|---|---|---|
| 3,192,408 | 6/1965 | Cho | 307/268 X |
| 3,783,398 | 1/1974 | Dann | 307/268 X |
| 4,001,608 | 1/1977 | Zuk | 307/268 |
| 4,140,928 | 2/1979 | Miyamoto | 307/273 |

Primary Examiner—John S. Heyman
Attorney, Agent, or Firm—Gerald J. Ferguson, Jr.; Joseph J. Baker

[57] ABSTRACT

In a monostable multivibrator including a gate circuit having first and second inputs, a differentiating circuit responsive to the output of the gate circuit and a voltage comparison circuit responsive to the output of the differentiating circuit where the gate circuit is adapted to have a trigger pulse applied to the first input thereof and the output of the voltage comparison circuit fed back to the second input thereof, the improvement in the monostable multivibrator of means for setting the reference level of the trigger pulse at the first input lower than the reference level of the output of the voltage comparison circuit fed back to the second input of the gate circuit.

1 Claim, 17 Drawing Figures

MONOSTABLE MULTIVIBRATOR

RELATED APPLICATIONS

This application is related to U.S. Application Ser. No. 859,539, filed Dec. 12, 1977 (now U.S. Pat. No. 4,182,963 granted Jan. 8, 1980) and two other U.S. Applications filed by the same applicants on the same date (Dec. 8, 1978) as the present application, the two other applications (U.S. Ser. Nos. 967,640 and 967,636) being respectively entitled "Improved Trigger Pulse Forming Circuit" and "Improved Monostable Multivibrator".

BACKGROUND OF THE INVENTION

This invention relates to an improved monostable multivibrator for eliminating the fluctuation of output pulse width related to changes in the repeated cycle of an input pulse signal used for trigger signal generation.

As shown in FIG. 1, a conventional monostable multivibrator consists of a gate circuit (for example, an OR circuit) 1, a differentiating circuit 4 comprised of a differentiating capacitor 5 and a differentiating resistor 6, a driver circuit or a transistor switching circuit 2 comprising a transistor 3 connected to the output of gate circuit 1 where circuit 2 drives differentiating circuit 4, and a voltage comparison circuit (for example, an inverter) 7 that uses the output of differentiating circuit 4 as an input and feeds back the output as one input to gate circuit 1. The operation is such that when a trigger pulse is impressed on the other input terminal of gate circuit 1, an output pulse is obtained from the output terminal OUT of voltage comparison circuit 7.

In order to operate the conventional monostable multivibrator shown in FIG. 1, a trigger pulse with a narrower pulse width than that of the output of the monostable multivibrator is necessary. This trigger pulse is obtained by shaping the input pulse signal shown in FIG. 2(a) that is supplied to the input terminal IN of the trigger pulse forming circuit T. In the case of forming a trigger pulse from a rising (or falling) input pulse signal by the above trigger pulse forming circuit T, the low level voltage of the trigger pulse when the trigger pulse is a positive pulse, or the high level voltage of the trigger pulse when it is a negative pulse, vibrates at the rising (or falling) of the input signal to the trigger pulse forming circuit. This is illustrated in FIG. 2(b) where a trigger pulse waveform is shown as obtained with trigger pulse forming circuit T where illustrative circuitry for effecting the function of circuit T is described in co-pending Application Ser. No. 859,539, filed Dec. 12, 1977 where the logic of the circuitry disclosed in the foregoing application would be reversed. It should be understood that circuit T may also be implemented by circuitry other than that of the foregoing co-pending application. When the monostable multivibrator is operated by the trigger pulse width of the monostable multivibrator output pulse shown in FIG. 2(c) fluctuates at the time when the repeated cycle input pulse signal of the trigger pulse forming circuit changes returning the monostable multivibrator from the metastable state to the stable state and that coincides with the vibrating portion of the above-mentioned trigger pulse reference levels where in this specification the reference levels are chosen, for purposes of illustration, to be the low level side of a positive pulse and the high level side of a negative pulse.

If such a monostable multivibrator is used, for example, in the pulse count wave detector of an FM receiver, it would be disadvantageous in that the demodulated signal from the pulse count wave detector would appear distorted.

SUMMARY OF THE INVENTION

This invention was made in view of the above-mentioned problem, and the object is to produce a monostable multivibrator without the aforesaid shortcoming.

Other objects and advantages of this invention will be apparent from a reading of the following specification and claims taken with the drawing.

DETAILED DESCRIPTION OF PREFERRED EMBODIMENTS OF THE INVENTION

Figure 1:
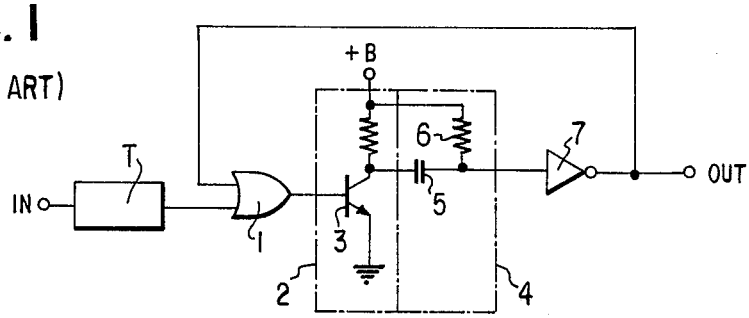
FIG. 1 is a block diagram of a conventional monostable multivibrator.
Figure 2:
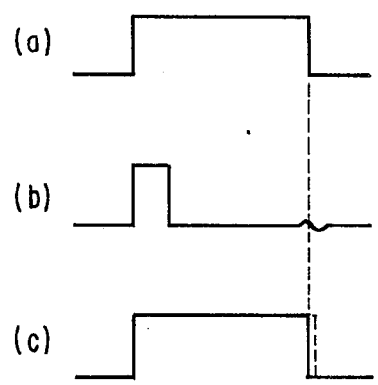
FIG. 2 is a diagram of waveforms appearing at different points in FIG. 1.
Figure 3:
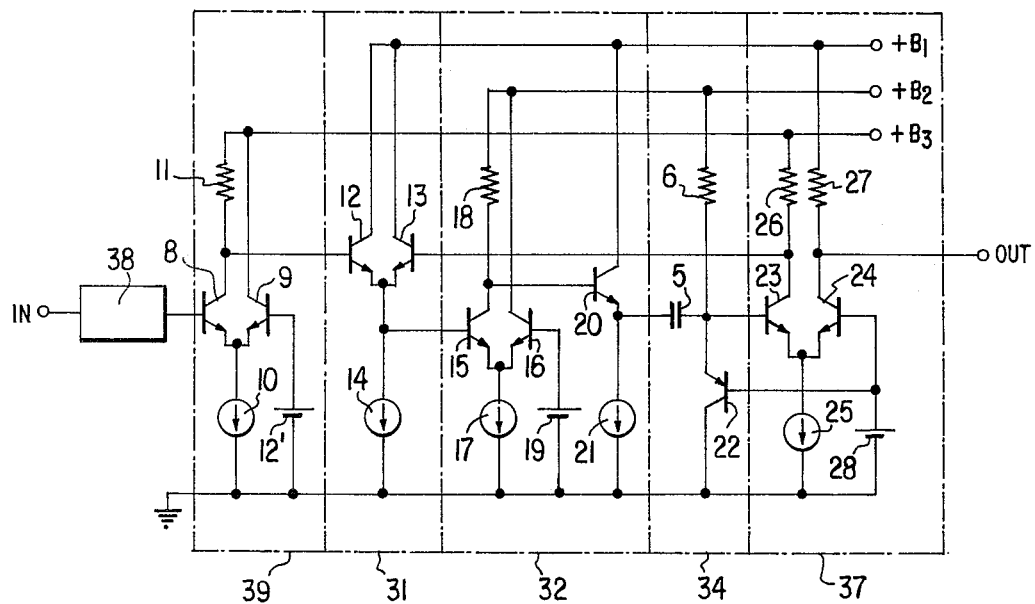
FIG. 3 is a circuit diagram of an illustrative monostable multivibrator in accordance with this invention.

Referring to the drawing where like reference numerals refer to like parts, there is shown in FIG. 3 a trigger pulse forming circuit 38 to which an input signal of limited amplitude is applied. 39 is a trigger pulse shaping circuit that shapes the output waveform of trigger pulse forming circuit 38.

The trigger pulse shaping circuit 39 comprises a differential amplifier comprising a transistor 8 responsive to the output of trigger pulse forming circuit 38, transistor 9 biased by the voltage of a power supply 12', a constant current source 10, and a load resistor 11 for transistor 8. Pulse shaping circuit 39 inverts and amplifies the output of trigger pulse forming circuit 38.

The illustrative monostable multivibrator of this invention comprises a gate circuit 31, a driver circuit 32, a differentiating circuit 34, and a voltage comparison circuit 37.

The gate circuit 31 consists of transistors 12 and 13 and a constant current source 14. The emitters of transistors 12 and 13 are connected in common as are the collectors. The emitters are grounded through constant current source 14 and the collectors are connected to a power supply $+B_1$. The circuit comprises an OR gate circuit that takes a logical sum of the output of trigger pulse shaping circuit 39, which is applied to the base of transistor 12, and one output of voltage comparison circuit 37, which is applied to the base of transistor 13.

The driver circuit 32 comprises a differential amplifier that includes a transistor 15 responsive to the output of gate circuit 31, a transistor 16 biased by a power supply 19, a constant current source 17, and a load resistor 18 for transistor 15. Driver circuit 32 inverts and outputs the output of gate circuit 31 where a transistor 20 provides an emitter-follower connection and 21 is a constant current source.

The differentiating circuit 34 comprises a differentiating capacitor 5, a differentiating resistor 6, and a transistor 22 which clamps the reference level of the differentiated outputs of differentiating capacitor 5 and differentiating resistor 6. 28 is a power supply that supplies the base bias to the base of transistor 22.

The voltage comparison circuit 37 comprises a differential amplifier which includes a transistor 23 responsive to the output of differentiating circuit 34, a transistor 24 biased by the voltage of power supply 28, a constant current source 25 and respective load resistors 26 and 27 for transistors 23 and 24 where the output of transistor 23 feeds back to gate circuit 31 and the output of transistor 24 is applied to an output terminal OUT of the monostable multivibrator.

Furthermore, the input voltage of transistor 12 of gate circuit 31 is determined by the resistance of load resistor 11 and the current value of constant current source 10 respectively of trigger pulse shaping circuit 39. The input voltage of transistor 13 is determined by the resistance of load resistor 26 and the current value of current source 25 of voltage comparison circuit 37. The input voltage of transistor 12 without a trigger pulse from the trigger pulse shaping circuit 39 is set lower than the stable state input voltage fed back to the transistor 13 from voltage comparison circuit 37. In other words, it is set so that the reference level voltage of the input at the base of transistor 13 is higher than the reference level voltage of the input at the base of transistor 12.

Figure 4:
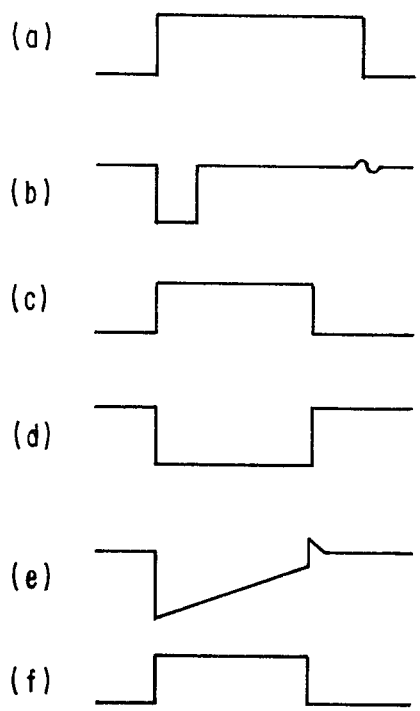
FIGS. 4(a), (b), (c), (d), (e), and (f), FIGS. 5(a), (b) and (c) are waveforms appearing at different points in the monostable multivibrator of FIG. 3.

The operation of the above illustrative monostable multivibrator is as follows. When an input signal as shown in FIG. 4(a) is applied to trigger pulse forming circuit 38, an output pulse with a narrow pulse width as shown in FIG. 4(b) is outputted from trigger pulse forming circuit 38. It is shaped and inverted by trigger pulse shaping circuit 39, and applied to gate circuit 31. The output waveform of gate circuit 31 thus assumes the shape shown in FIG. 4(c). The output of gate circuit 31 shown in FIG. 4(c) is inverted by driver circuit 32 and an output having a waveform as shown in FIG. 4(d) is outputted from driver circuit 32. At this time, the output impedance of driver circuit 32 is reduced by transistor 20 and the driving capacity of driver circuit 32 to drive differentiating circuit 34 increases. The output of driver circuit 32 as shown in FIG. 4(d) is differentiated by differentiating circuit 34, and its reference level is clamped by transistor 22 and the output shown in FIG. 4(e) is generated. This output of differentiating circuit 34 is fed back to the base of transistor 13 of gate circuit 31 through voltage comparison circuit 37 as the FIG. 4(f) waveform using the voltage of power supply 28 as the threshold voltage. The inverted output of the output shown in FIG. 4(f) is outputted from the output terminal OUT as the output pulse of the monostable multivibrator.

Figure 5:
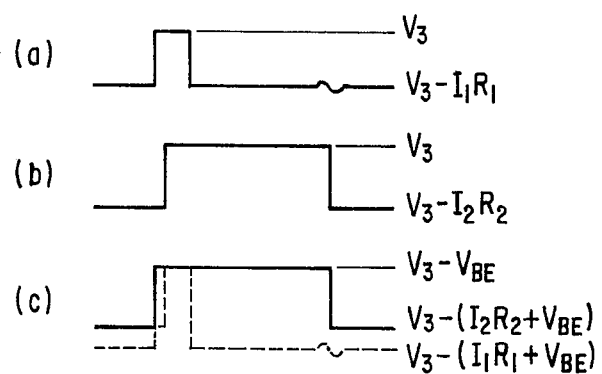

In the above case, the voltage impressed on the base of transistor 12 of gate circuit 31 is as shown in FIG. 5(a) where its reference level is $V_3-I_1R_1$ and its peak level (In this specification, the peak level is the high level side of a positive pulse and the low level side of negative pulse.) is $V_3$ where $V_3$ is the voltage of power supply $+B_3$, $I_1$ is the current of constant current source 14 and $R_1$ is the resistance of load resistor 11. The voltage impressed on the base of transistor 13 is as shown in FIG. 5(b) and its reference level is $V_3-I_2R_2$ where the peak level is $V_3$, $I_2$ is the current of constant current source 25 and $R_2$ is the resistance of load resistor 26.

Since gate circuit 31 comprises an OR gate circuit including transistors 12 and 13 and the reference level of the base input of transistor 12 is set lower than the reference level of the base input of transistor 13, the reference levels of the base inputs of transistors 12 and 13 have the $(V_3-I_1R_1)<(V_3-I_2R_2)$ relation. This condition is satisfied by making $I_1R_1>I_2R_2$. Consequently, the output of gate circuit 31 at no-signal time occurs at the higher side of the respective emitter potential, $(V_3-I_1R_1-V_{BE})$ or $(V_3-I_2R_2-V_{BE})$ of transistors 12 and 13 when they are independent. As shown in FIG. 5(c) by a solid line, the reference level output is $V_3-I_2R_2-V_{BE}$ where the peak level is $V_3$ and $V_{BE}$ is the voltage between the emitter and base of transistors 12 and 13. And, the broken line in FIG. 5(c) is the waveform of the emitter output of transistors 12 and 13 respectively when the transistors 12 and 13 are independent.

At the falling point of the input signal of the trigger pulse forming circuit 38 shown in FIG. 4(a), the input and output capacity coupling of trigger pulse forming circuit 38 or the power supply line impedance of trigger pulse forming circuit 38 is not sufficiently low for the rapidly changing current. Thus, a portion of the line of the reference level of the output waveform of trigger pulse forming circuit 38 vibrates as shown in FIG. 4(b) with a broken line. Also, the reference level of the base input of transistor 12 also vibrates as shown in FIG. 5(a) with a broken line.

However, even in the case when the repeated cycle input signal of the trigger pulse forming circuit 38 shown in FIG. 4(a) changes, returning the monostable multivibrator from the metastable state to the stable state, and that coincides with the rising point of the input signal of trigger pulse forming circuit 38 as shown in FIGS. 5(a), (b), and (c), the reference level of the base input of transistor 12 is not outputted to driver circuit 32 because the reference level of base input of transistor 13 is set higher than the reference level of the base input of the transistor 12. Therefore, there is no reference level vibration of a broken line in the waveforms of FIGS. 4(c), (d), and (f) and even when the repeated cycle input signal of the trigger pulse forming circuit 38 changes, it does not cause the pulse width of the monostable multivibrator output pulse to fluctuate. Rather, it remains stable.

As described above, with the present invention, the pulse width of the monostable multivibrator output pulse does not fluctuate even when the repeated cycle input signal wave changes because the input signal reference level of the trigger pulse input side of the gate circuit (that is, the no-signal time voltage of the trigger pulse) is set at a different value from the input signal reference level of the input side of the feedback voltage of the gate circuit (that is, the no-signal time voltage of the feedback signal), so that the no-signal time voltage of the trigger pulse is lower in relation thereto and will not appear at the gate circuit output. In addition, when the monostable multivibrator of this invention is used, for example, as a pulse count wave detector of an FM receiver, distortion in the demodulated output signal can be eliminated.

What is claimed is:

1. In a monostable multivibrator including a gate circuit having first and second inputs, a differentiating circuit responsive to the output of said gate circuit and a voltage comparison circuit responsive to the output of the said differentiating circuit where said gate circuit is adapted to have a trigger pulse applied to said first input thereof and the output of said voltage comparison circuit fed back to said second input thereof, the improvement in said monostable multivibrator of means for setting the reference level of said trigger pulse at said first input lower than the reference level of the output of said voltage comparison circuit fed back to said second input of said gate circuit.

* * * * *